United States Patent
Lee

(10) Patent No.: US 11,005,578 B1
(45) Date of Patent: May 11, 2021

(54) DIAGNOSIS SYSTEM AND DIAGNOSIS METHOD OF ACTIVE TRANSMISSION CABLE PERFORMANCE

(71) Applicant: James Cheng Lee, La Habra, CA (US)

(72) Inventor: James Cheng Lee, La Habra, CA (US)

( * ) Notice: Subject to any disclaimer, the term of this patent is extended or adjusted under 35 U.S.C. 154(b) by 0 days.

(21) Appl. No.: 16/895,031

(22) Filed: Jun. 8, 2020

(51) Int. Cl.
*H04B 3/46* (2015.01)
*H04B 17/00* (2015.01)
*H04B 17/30* (2015.01)

(52) U.S. Cl.
CPC ......... *H04B 17/0085* (2013.01); *H04B 17/30* (2015.01)

(58) Field of Classification Search
CPC .............................. H04B 17/0085; H04B 17/30
USPC .......................................... 375/224–228, 257
See application file for complete search history.

(56) References Cited

U.S. PATENT DOCUMENTS

| | | | |
|---|---|---|---|
| 6,516,053 B1* | 2/2003 | Ryan ..................... | H04M 3/305 379/19 |
| 9,927,285 B2* | 3/2018 | Piety ....................... | G01H 1/00 |
| 2009/0271836 A1* | 10/2009 | Maxson ................ | H04N 17/00 725/107 |
| 2016/0204809 A1* | 7/2016 | Pratt ..................... | H03F 1/3223 375/219 |
| 2016/0323045 A1* | 11/2016 | Hernandez .......... | H04B 17/104 |

* cited by examiner

*Primary Examiner* — Don N Vo
(74) *Attorney, Agent, or Firm* — Lin & Associates Intellectual Property, Inc.

(57) ABSTRACT

A diagnosis system of active transmission cable performance applying a diagnosis method of active transmission cable performance. The diagnosis system of active transmission cable performance includes a diagnostic host and a test board. The diagnostic host has a diagnosis main program module. The diagnosis main program module has a plurality of test suites. The test board has a switch calculation unit for making an active transmission cable module switched among different signal transmission modes so as to proceed with a test and a verification. The diagnostic host and the active transmission cable module are connected with each other by a wire transmission technology, and the test board and the active transmission cable module are connected with each other by a wireless transmission technology.

18 Claims, 6 Drawing Sheets

DIAGNOSIS SYSTEM AND DIAGNOSIS METHOD OF ACTIVE TRANSMISSION CABLE PERFORMANCE

BACKGROUND OF THE INVENTION

1. Field of the Invention

The present invention generally relates to a diagnosis system and a diagnosis method of transmission cable performance, and more particularly to a diagnosis system and a diagnosis method of active transmission cable performance applied in an active transmission cable test environment.

2. The Related Art

In recent years, a longer transmission distance is needed to be applied in building a system environment, a requirement and an application of an active transmission cable is increased day by day.

A Taiwan patent with a publication number of TW201321818A is disclosed. The Taiwan patent is with a title of active fiber cable and electronic device using the same. The above-mentioned Taiwan patent discloses an active transmission cable which is an active fiber cable, and a related electronic device. The active transmission cable has a connecting portion which has a photo-electricity converting and processing chip. The photo-electricity converting and processing chip includes a pair of transmission signal input pins which include a positive transmission input pin and a negative transmission input pin. The positive transmission input pin and the negative transmission input pin are coupled with a positive transmission end and a negative transmission end of an equipment.

The above-mentioned technology is similar to a serial usually used by a wired high-speed data transmission (such as: USB 3.0) on current market, a Serdes (Serializer/Deserializer) serial is mostly used.

A Serdes serial usually includes a transmitter (TX), a receiver (RX) and a transmission channel. The transmitter is used for serializing parallel multipath signals into one way signal, and then the one way signal is transmitted into a transmission path, the receiver is used for receiving serial signals, and the serial signals are relieved to be serialized into the multipath signals.

A current serdes design is gradually developed towards a high-frequency and high-speed direction, if the transmission channel is the ideologically lossless transmission cable, signals sent by the transmitter will be arrived at the receiver completely. Nevertheless, because the transmission channel exists a skin effect and losses of transmission mediums, the transmission channel frequently shows a low-pass characteristic. A loss generated by the skin effect is in direct proportion to a square root of a signal frequency, and the losses of the transmission mediums are proportional to the signal frequency. So when the signal frequency is lower, the losses of the transmission channel is mainly decided on the skin effect. For the transmission channel transmitting the high-frequency signals, the losses of the transmission mediums have a leading function.

However, it is false that a factor of really affecting signal reliability transmission is an attenuation, that an attenuation of the transmission channel is changed according to frequency changes is the factor of really affecting signal reliability transmission. An attenuation difference between a low-frequency signal and a high-frequency signal finally causes an Inter-Symbol Interference (ISI). So the signal attenuation is without becoming a problem which is needed to be solved, while a problem which is needed to be solved is the attenuation difference between the low-frequency signal and the high-frequency signal.

A bit error rate (BER) and an eye diagram in this field are usually used to show quality of transmission signals of transmission cables, the eye diagram is a waveform of making the signals captured according to unit time intervals and the signals are overlapped together, a shape of the eye diagram is similar to an eye. When the eye diagram is expanded, the got signals are judged to have no error code. For general noise information signals, a frequency spectrum component is quite complex, and the frequency spectrum component includes various components ranged from low frequencies to high frequencies, so when the attenuation difference between the low-frequency signal and the high-frequency signal is overly larger, the eye diagram will be closed to make the receiver generate error codes.

In order to achieve an effectiveness of measurement results, a Pseudo Random Bit Sequence (PRBS) way is generally adopted, an advantage of encoding in this way is that all statuses will be divided in average after a loop is operated, so that a shape of the eye diagram is symmetrical.

When the transmission channel is a cable which is without being ideologically lossless, the signals will generate a symbol interference (ISI) to cause the eye diagram closed. In order to solve the problems described above, a set of balance system is developed for eliminating an intersymbol interference, an equilibrium represents an imperfection of a compensation channel of the transmitter or the receiver so as to make the eye diagram of the receiver expanded again. In a frequency domain, it is comprehended that the equilibrium is the low-pass characteristic through a high-pass filter compensation channel. In a time domain, it is comprehended that the equilibrium is a remolding of impulse response signals, energies of the impulse response signals are limited within a time interval for preventing the intersymbol interference.

A common equilibrium system of the serdes serial generally includes a feed forward equalizer (FFE) of the transmitter, a continuous time linear equalizer (CTLE) of the receiver and a decision feedback equalizer (DFE).

In addition, for the moment, a conventional diagnosis method using the above-mentioned bit error rate and the eye diagram to show transmission signal quality of the transmission cable, the conventional diagnosis method is generally used in a passive transmission cable.

Thus an innovative diagnosis system and an innovative diagnosis method of active transmission cable performance are provided, the innovative diagnosis system of active transmission cable performance is capable of effectively communicating with various communication modules of an active transmission cable, and a main diagnosis program is executed to complete an active transmission cable performance diagnosis for judging whether an active transmission cable performance is conformed to a requirement of a network system.

SUMMARY OF THE INVENTION

An object of the present invention is to provide a diagnosis system of active transmission cable performance applying a diagnosis method of active transmission cable performance. The diagnosis system of active transmission cable performance includes a diagnostic host and a test board. The diagnostic host has a diagnosis main program module. The diagnosis main program module has a plurality of test suites. The test board has a switch calculation unit for making an active transmission cable module switched among different signal transmission modes so as to proceed with a test and a verification. The diagnostic host and the active transmission cable module are connected with each other by a wire transmission technology, and the test board and the active transmission cable module are connected with each other by a wireless transmission technology.

Another object of the present invention is to provide a diagnosis system of active transmission cable performance applying a diagnosis method of active transmission cable performance. The diagnosis system of active transmission cable performance includes a diagnostic host having a diagnosis main program module, and a test board. The diagnosis main program module has a plurality of test suites. The diagnosis main program module includes a management test suite supporting communications of standard management interfaces of a plurality of pluggable transceiver modules, a serdes test suite including a non-return-to-zero signal transmission, a signal transmission of four-order pulse amplitude modulation, a bit error rate analysis and an eye diagram analysis of high-frequency signal transmission, and a diagnosis test suite including an intersymbol interference test and a temperature monitoring test. The test board has a switch calculation unit for making an active transmission cable module switched among different signal transmission modes so as to proceed with a test and a verification. The diagnostic host and the active transmission cable module are connected with each other by a wire transmission technology, and the test board and the active transmission cable module are connected with each other by a wireless transmission technology.

Another object of the present invention is to provide a diagnosis method of active transmission cable performance applied in a diagnosis system of active transmission cable performance. Specific steps of the diagnosis method of active transmission cable performance are described hereinafter. A setting and diagnosing step for letting a user to set different binary sequence values of pseudo random numbers, and executing a bit error rate analysis and an eye diagram diagnosis analysis, an intersymbol interference test and a temperature monitoring test. An inputting and fetching step, after the user sets the different binary sequence values of pseudo random numbers, enter a program interface to proceed with an inputting setup, and simultaneously, after the bit error rate analysis, the eye diagram diagnosis analysis, the intersymbol interference test and the temperature monitoring test are completed, diagnosis results of the bit error rate analysis, the eye diagram diagnosis analysis, the intersymbol interference test and the temperature monitoring test are fetched. A driving and storing step for driving, controlling, displaying and storing diagnosis results of a loop test, a non-return-to-zero signal transmission test and a signal transmission test of four-order pulse amplitude modulation.

As described above, the method of active transmission cable performance is used in an active transmission cable, all the tests under the signal transmission mode are capable of being completed at a time and all the tests have no need of being manually switched to effectively reduce a human resource cost.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
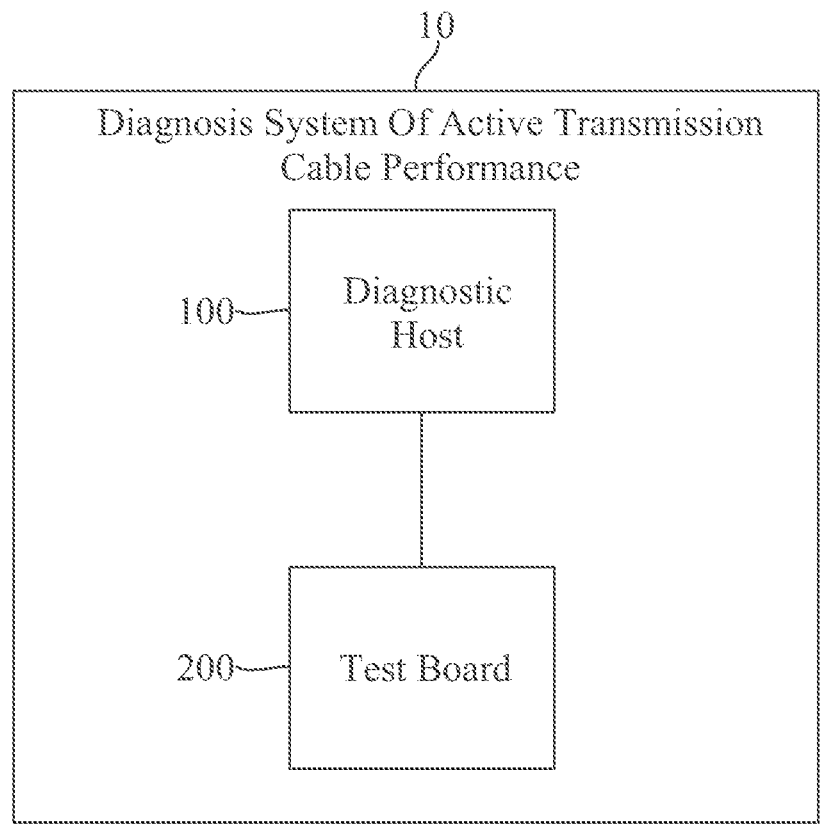
FIG. 1 is a block diagram of a diagnosis system of active transmission cable performance in accordance with the present invention.
Figure 2:
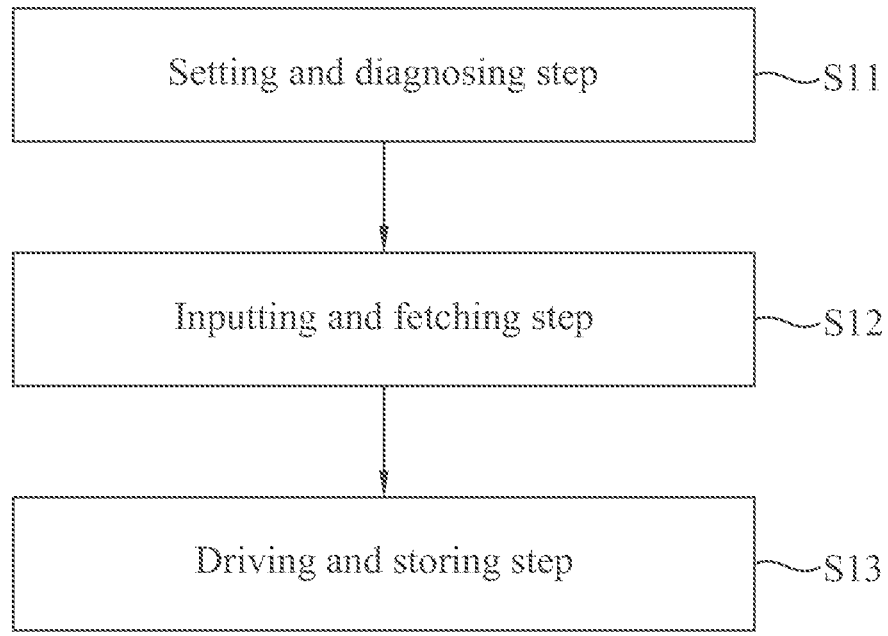
FIG. 2 is a flow chart showing steps of a diagnosis method of active transmission cable performance applied in the diagnosis system of active transmission cable performance in accordance with the present invention.
Figure 4:
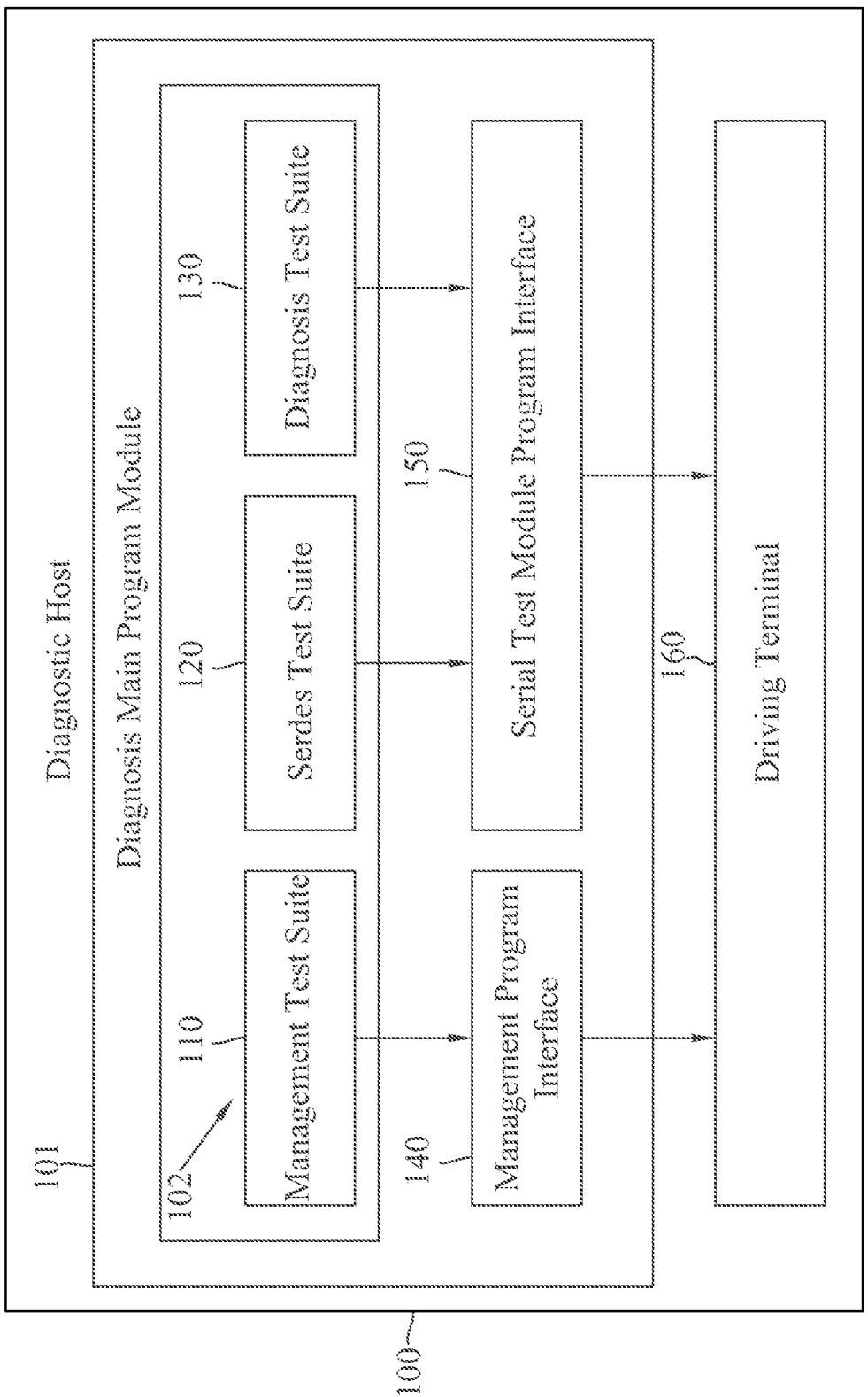
FIG. 4 is a block diagram of a diagnostic host of the diagnosis system of active transmission cable performance of FIG. 3.
Figure 5:
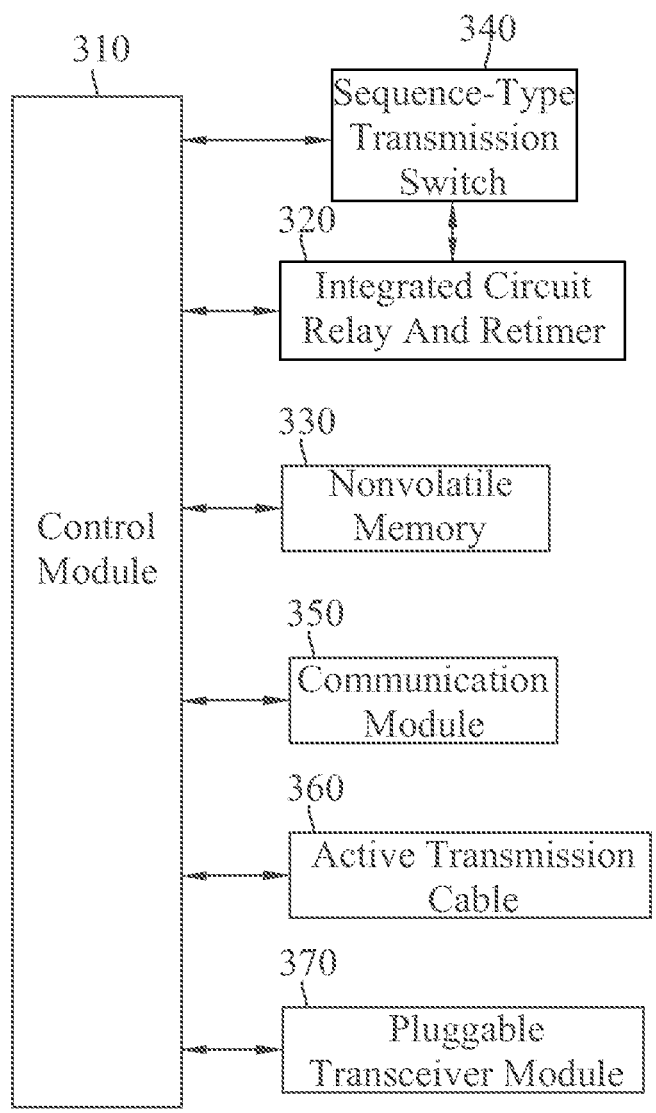
FIG. 5 is a block diagram of the active transmission cable module connected with the diagnosis system of active transmission cable performance of FIG. 3.

With reference to FIG. 1 and FIG. 4, a diagnosis system of active transmission cable performance 10, and a diagnosis method of active transmission cable performance applied in the diagnosis system of active transmission cable performance 10 in accordance with the present invention are shown. A block diagram of the diagnosis system of active transmission cable performance 10 in accordance with the present invention is shown in FIG. 1. The diagnosis system of active transmission cable performance 10 applying the diagnosis method of active transmission cable performance, includes a diagnostic host 100 having a diagnosis main program module 101, and a test board 200.

Preferably, the diagnostic host 100 and the test board 200 are connected with each other by virtue of an integrated circuit busbar.

Preferably, the diagnostic host 100 is a server or a personal computer (PC).

The diagnosis system of active transmission cable performance 10 is connected with an active transmission cable module 300. The diagnostic host 100, and the active transmission cable module 300 which is to be tested are connected with each other by a wire transmission technology, and the test board 200 and the active transmission cable module 300 are connected with each other by a wireless transmission technology to proceed with the high-speed data transmission. The wire transmission technology applies an integrated circuit bus. The wireless transmission technology applies a local area network (LAN) emulation.

The diagnosis main program module 101 has a plurality of test suites 102. The diagnosis main program module 101 controls an active transmission cable 360 which is to be tested through the plurality of the test suites 102. The active transmission cable 360 is applied to the active transmission cable module 300. The active transmission cable 360 which is to be tested is transferred from a normal work mode to a diagnosis mode. A user sets different binary sequence values of pseudo random numbers (PRBS) by virtue of the diagnostic host 100. A bit error rate analysis and an eye diagram diagnosis analysis are executed, and a symbol interference test and a temperature monitoring test and other tests are executed.

The test board 200 has a switch calculation unit 201 for making the active transmission cable module 300 switched among different signal transmission modes so as to proceed with a test and a verification.

Referring to FIG. 1 to FIG. 5, specific steps of a flow chart of the diagnosis method of active transmission cable performance applied in the diagnosis system of active transmission cable performance 10 are described as follows. The method of active transmission cable performance is used in the active transmission cable 360. The specific steps of the diagnosis method of active transmission cable performance include a step S11, a step S12 and a step S13.

At first, in the step S11, the step S11 is a setting and diagnosing step for letting a user to set the different binary sequence values of pseudo random numbers by the user and by virtue of the diagnostic host 100, executing the bit error rate analysis and the eye diagram diagnosis analysis, the symbol interference test and the temperature monitoring test and other tests, and then proceeding with the next step S12.

Then, in the step S12, the step S12 is an inputting and setting step, after the user sets the different binary sequence values of pseudo random numbers (PRBS), the user enters a program interface to proceed with an inputting setup, the active transmission cable 360 which is to be tested is transferred from the normal work mode to the diagnosis mode, and simultaneously, after the bit error rate analysis, the eye diagram diagnosis analysis, the intersymbol interference test and the temperature monitoring test are completed, diagnosis results of the bit error rate analysis, the eye diagram diagnosis analysis, the intersymbol interference test and the temperature monitoring test are fetched, and then proceed with the next step S13.

At last, in the step S13, step S13 is a driving and storing step for driving, controlling, displaying and storing diagnosis results of a loop test, a non-return-to-zero signal transmission test and a signal transmission test of four-order pulse amplitude modulation (PAM-4), specifically, drive and control the diagnostic host 100 and the test board 200 by the diagnosis main program module 101, display the diagnosis results of the loop test, the non-return-to-zero signal transmission test and the signal transmission test of four-order pulse amplitude modulation and other tests, and the diagnosis results of the loop test, the non-return-to-zero signal transmission test and the signal transmission test of four-order pulse amplitude modulation and other tests are stored in the diagnostic host 100.

The non-return-to-zero signal transmission test and the signal transmission test of four-order pulse amplitude modulation (PAM-4) are a signal transmission encoding process, namely a signal transmission mode.

A non-return-to-zero signal transmission is a binary signal code. In a non-return-to-zero signal transmission mode, 1 and 0 represent different electronic statuses to be shown, respectively, no neutral status and other statuses are included in the non-return-to-zero signal transmission mode. In a signal transmission mode of four-order pulse amplitude modulation, each pulse has four code levels: 0, 1, 2 or 3. 0, 1, 2 and 3 represent the different electronic statuses to be shown. In a whole bit group, two pulses will be encoded.

In order to further know structure characteristics, application means and anticipated effects of the present invention, a usage way of the diagnosis system of active transmission cable performance 10 in accordance with the present invention is described, and so it is believed that the present invention is able to be specifically and deeply known.

Figure 3:
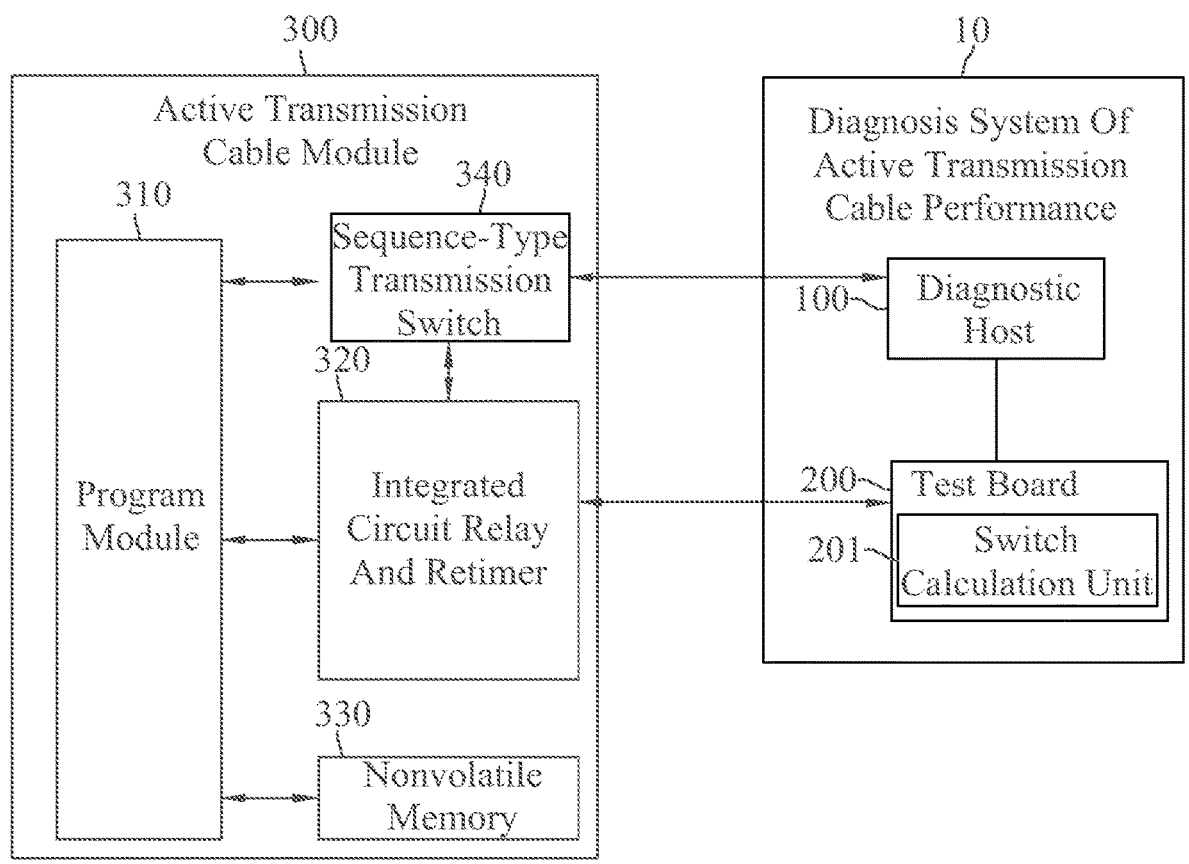
FIG. 3 is a block diagram of the diagnosis system of active transmission cable performance in accordance with the present invention, wherein the diagnosis system of active transmission cable performance is connected with an active transmission cable module.

Referring to FIG. 1 to FIG. 5, a block diagram of the diagnosis system of active transmission cable performance in accordance with the present invention, wherein the diagnosis system of active transmission cable performance 10 is connected with the active transmission cable module 300 is shown in FIG. 3. The diagnosis system of active transmission cable performance 10 which includes the diagnostic host 100 having the diagnosis main program module 101, and the test board 200 is connected with the active transmission cable module 300.

The active transmission cable module 300 and the diagnostic host 100 are connected with each other by virtue of the integrated circuit bus. The active transmission cable module 300 and the test board 200 are connected with each other by virtue of the LAN emulation to proceed with the high-speed data transmission.

Referring to FIG. 3, the active transmission cable module 300 includes a high-speed SerDes I/O (Input/Output) and a processor management interface. The active transmission cable module 300 includes a plurality of pluggable transceiver modules 370.

The active transmission cable module 300 further includes a control module 310, an integrated circuit (IC) relay and retimer 320, a nonvolatile memory 330 and a sequence-type transmission switch 340.

The control module 310 is able to be a microcontroller unit (MCU) or an application processor (AP). The control module 310 is acted for a busbar interface management, a component control and a memory management.

The integrated circuit relay and retimer 320 is mainly applied in the non-return-to-zero signal transmission test, the signal transmission test of four-order pulse amplitude modulation and other signal transmission tests. Functions of the integrated circuit relay and retimer 320 include a clock data recovery (CDR) and an equalizer circuit design. The integrated circuit relay and retimer 320 supports high-speed transmission technologies of serdes 10 Gbps, 25 Gbps, 50 Gbps or 100 Gbps. The integrated circuit relay and retimer 320 executes a forward feedback equilibrium of a transmitter, a linear equalization of continuous time of a receiver and so on. The integrated circuit relay and retimer 320 supports a communication of the binary sequence values of the pseudo-random numbers, a forward error correction (FEC) communication and other communication technologies, and the integrated circuit relay and retimer 320 supports a bit error rate analysis function, an eye diagram monitoring function and other functions.

It need be described in further, the above-mentioned forward error correction communication technology is a technology of controlling transmission errors in a single communication system. Send extra information through combined data to proceed with an error recovery so as to lower a bit error rate.

The nonvolatile memory 330 is an electrically-erasable programmable read-only memory (EEPROM), a flash memory, or a solid-state drive (SSD) etc.

The sequence-type transmission switch 340 is acted as a part of the active transmission cable module 300 and the diagnostic host 100 which are connected with each other by the integrated circuit bus.

Referring to FIG. 1 to FIG. 6, a block diagram of the diagnostic host 100 of the diagnosis system of active transmission cable performance 10 in accordance with the preferred embodiment of the present invention is shown in FIG. 4. The plurality of the test suites 102 of the diagnosis main program module 101 include a management test suite 110, a serdes test suite 120, a diagnosis test suite 130, a management program interface 140 and a serial test module program interface 150.

The management test suite 110 supports communications of standard management interfaces of the plurality of the pluggable transceiver modules 370 and sets the diagnosis mode. A diagnosis mode set of the user and a set of the binary sequence values of pseudo random numbers (PRBS) are provided by aiming at a signal transmission mode of the active transmission cable 360. Each pluggable transceiver module 370 is one of a QSFP (Quad Small Form-factor Pluggable) 28 module, a QSFP56 module, a QSFP-DD module, an OSFP (Octal Small Form Factor Pluggable) module and others. Each pluggable transceiver module 370 is an interface element which converts an electrical signal into an optical signal.

The serdes test suite 120 includes a non-return-to-zero signal transmission, a signal transmission of four-order pulse amplitude modulation and so on, and provides a bit error rate analysis and an eye diagram diagnosis analysis of a high-frequency signal transmission. A main purpose is that the bit error rate analysis, the eye diagram diagnosis analysis and other data included by the active transmission cable module 300 are got through the test board 200.

After the serial test module program interface 150 completes the above-mentioned tests and analysises, an application program interface of a communication module test is provided under the serdes for controlling the diagnostic host 100 and the test board 200 to get the data.

The diagnosis test suite 130 includes the intersymbol interference test, and the temperature monitoring test etc.

The management program interface 140 provides the application program interface communicated with various communication modules 350 of the active transmission cable module 300. After the user sets the different binary sequence values of pseudo random numbers (PRBS), the management program interface 140 is entered to proceed with a setup to achieve a purpose of controlling the diagnostic host 100 and the test board 200. After the user executes the management tst suite 110, the user enters the management program interface 140 to proceed with the setup to make the active transmission cable module 300 switched from the work mode into the diagnosis mode.

After completing the above-mentioned tests and analysises, the serial test module program interface 150 provides the application program interface of a communication module test under the serdes so as to drive the diagnostic host 100 and the test board 200 to get the data.

At last, the diagnostic host 100 includes a driving terminal 160. The management program interface 140 and the serial test module program interface 150 control the driving terminal 160 to drive the diagnostic host 100 and the test board 200.

Figure 6:
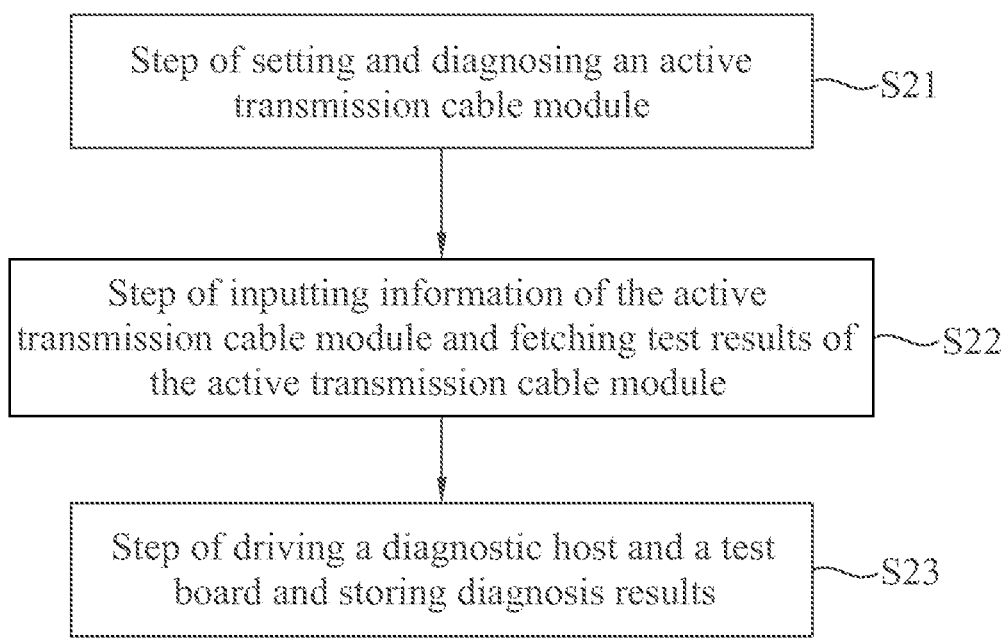
FIG. 6 is a flow chart showing steps of the diagnosis method of active transmission cable performance applied in the diagnosis system of active transmission cable performance of FIG. 3.

Referring to FIG. 1 to FIG. 6, a flow chart showing steps of the diagnosis method applied in the diagnosis system of active transmission cable performance 10 is shown in FIG. 6. The specific steps of the diagnosis method of active transmission cable performance applied in the diagnosis system of active transmission cable performance 10 includes a step S21, a step S22 and a step S23.

Firstly, in the step S21, the step S21 is a step of setting and diagnosing the active transmission cable module 300, specifically, let the user to set the different binary sequence values of pseudo random numbers by virtue of the diagnostic host 100 having the diagnosis main program module 101, and simultaneously, execute the bit error rate analysis, the eye diagram diagnosis analysis, the intersymbol interference test and the temperature monitoring test on the active transmission cable module 300, and then proceed with the step S22.

Secondly, the step S22 is a step of inputting information of the active transmission cable module 300 and fetching test results of the bit error rate analysis, the eye diagram diagnosis analysis, the intersymbol interference test and the temperature monitoring test of the active transmission cable module 300. In the step S22, specifically, after the user sets the different binary sequence values of pseudo random numbers (PRBS), the user enters the management program interface 140 to proceed with the inputting setup, the active transmission cable module 300 is transferred from the normal work mode to the diagnosis mode, and simultaneously, after the above-mentioned bit error rate analysis, the above-mentioned eye diagram diagnosis analysis, the above-mentioned intersymbol interference test and the above-mentioned temperature monitoring test are completed, the diagnosis results of the bit error rate analysis, the eye diagram diagnosis analysis, the intersymbol interference test and the temperature monitoring test are fetched, and proceed with the step S23.

At last, step S23 is a step of driving the diagnostic host 100 and the test board 200 and storing diagnosis results of the loop test, the non-return-to-zero signal transmission test, the signal transmission test of four-order pulse amplitude modulation and other tests. In the step S23, specifically, the diagnostic host 100 and the test board 200 are driven and controlled by virtue of the diagnosis main program module 101, the diagnosis results of the loop test, the non-return-to-zero signal transmission test, the signal transmission test of four-order pulse amplitude modulation and other tests are displayed on and are stored in the diagnostic host 100.

So the present invention has the following implementation effects and technology effects:

Firstly, the active transmission cable module 300 is switched among the different signal transmission modes by the switch calculation unit 201 of the test board 200. All tests under the signal transmission mode are capable of being completed at a time and all the tests have no need of manually switching to effectively reduce a human resource cost.

Secondly, the active transmission cable 360 which is to be tested is transferred from the normal work mode into the diagnosis mode through the plurality of the test suites 102 of the diagnosis main program module 101, after the user sets the different binary sequence values of Pseudo-Random Numbers by virtue of the diagnostic host 100. All the tests are completed at a time to achieve purposes of an automation for shortening test time and reducing the human resource cost.

Thirdly, all test results are displayed by and stored in the diagnostic host 100 in accordance with the present invention to prevent a recorder record in mistake so as to achieve reducing error rates of the test results.

The diagnosis method of active transmission cable performance mainly cooperates with the diagnosis system of active transmission cable performance 10 provided by the present invention to make the user simultaneously proceed with the tests and analysises of all the transmission modes on the active transmission cable 360 which is to be tested, and the test results are disposed on and stored in the diagnostic host 100 to achieve purposes of an automation, recording and reducing the human resource cost. The data include the above-mentioned test results of the bit error rate analysis, the eye diagram diagnosis analysis, the intersymbol interference test and the temperature monitoring test of the active transmission cable module 300, and diagnosis results of the loop test, the non-return-to-zero signal transmission test, the signal transmission test of four-order pulse amplitude modulation.

It need be described in further, the test board 200 in accordance with the present invention is without being limited to be connected with one active transmission cable module 300, the test board 200 is simultaneously capable of being connected with a plurality of the active transmission cable modules 300. The plurality of the active transmission cable modules 300 support the communications of the standard management interfaces of the plurality of the pluggable transceiver modules 370.

As described above, the method of active transmission cable performance is used in the active transmission cable 360, all the tests under the signal transmission mode are capable of being completed at a time and all the tests have no need of being manually switched to effectively reduce the human resource cost.

Implementation ways of the present invention are described by virtue of specific embodiments, a person having common knowledge in technical field easily knows other advantages and effects of the present invention by virtue of contents disclosed in the description of the present invention.

The above-mentioned description is the preferred embodiment of the present invention, an extent of the present invention is without being limited. Equivalent changes or modifications completed without braking away from a spirit disclosed in the present invention are all contained in patent claims of the present invention.

What is claimed is:

1. A diagnosis system of active transmission cable performance applying a diagnosis method of active transmission cable performance, the diagnosis system of active transmission cable performance comprising:
   a diagnostic host having a diagnosis main program module, the diagnosis main program module having a plurality of test suites; and
   a test board having a switch calculation unit for making an active transmission cable module switched among different signal transmission modes so as to proceed with a test and a verification,
   wherein the diagnostic host and the active transmission cable module are connected with each other by a wire transmission technology, and the test board and the active transmission cable module are connected with each other by a wireless transmission technology.

2. The diagnosis system of active transmission cable performance as claimed in claim 1, wherein the wire transmission technology applies an integrated circuit bus, the wireless transmission technology applies a local area network emulation.

3. The diagnosis system of active transmission cable performance as claimed in claim 1, wherein the diagnosis main program module includes a management test suite supporting communications of standard management interfaces of a plurality of pluggable transceiver modules, a serdes test suite including a non-return-to-zero signal transmission, a signal transmission of four-order pulse amplitude modulation, a bit error rate analysis and an eye diagram analysis of high-frequency signal transmission, and a diagnosis test suite including an intersymbol interference test and a temperature monitoring test.

4. The diagnosis system of active transmission cable performance as claimed in claim 3, wherein each pluggable transceiver module is one of a QSFP (Quad Small Form-factor Pluggable) 28 module, a QSFP56 module, a QSFP-DD module, an OSFP (Octal Small Form Factor Pluggable) module.

5. The diagnosis system of active transmission cable performance as claimed in claim 3, wherein each pluggable transceiver module is an interface element which converts an electrical signal into an optical signal.

6. The diagnosis system of active transmission cable performance as claimed in claim 3, wherein the non-return-to-zero signal transmission is a binary signal code.

7. The diagnosis system of active transmission cable performance as claimed in claim 3, wherein the diagnosis main program module includes a management program interface providing an application program interface communicated with various communication modules of the active transmission cable module, and a serial test module program interface providing the application program interface of a communication module test under a serdes so as to drive the diagnostic host and the test board to get data, after the user executes the management test suite, the management program interface is entered to proceed with a setup to make the active transmission cable module switched from a work mode into a diagnosis mode.

8. The diagnosis system of active transmission cable performance as claimed in claim 7, wherein after the serial test module program interface completes the tests and analysises, the application program interface of the communication module test is provided under the serdes for controlling the diagnostic host and the test board to get the data.

9. The diagnosis system of active transmission cable performance as claimed in claim 7, wherein the data include test results of the bit error rate analysis, the eye diagram diagnosis analysis, the intersymbol interference test and the temperature monitoring test of the active transmission cable module, and diagnosis results of a loop test, a non-return-to-zero signal transmission test and a signal transmission test of four-order pulse amplitude modulation.

10. The diagnosis system of active transmission cable performance as claimed in claim 9, wherein the non-return-to-zero signal transmission test and the signal transmission test of four-order pulse amplitude modulation are a signal transmission encoding process.

11. The diagnosis system of active transmission cable performance as claimed in claim 1, wherein the diagnostic host is a server.

12. The diagnosis system of active transmission cable performance as claimed in claim 1, wherein the diagnostic host is a personal computer.

13. A diagnosis system of active transmission cable performance applying a diagnosis method of active transmission cable performance, the diagnosis system of active transmission cable performance comprising:
   a diagnostic host having a diagnosis main program module, the diagnosis main program module having a plurality of test suites, the diagnosis main program module including a management test suite supporting communications of standard management interfaces of a plurality of pluggable transceiver modules, a serdes test suite including a non-return-to-zero signal transmission, a signal transmission of four-order pulse amplitude modulation, a bit error rate analysis and an eye diagram analysis of high-frequency signal transmission, and a diagnosis test suite including an intersymbol interference test and a temperature monitoring test; and a test board having a switch calculation unit for making an active transmission cable module switched among different signal transmission modes so as to proceed with a test and a verification, wherein the diagnostic host and the active transmission cable module are connected with each other by a wire transmission technology, and the test board and the active transmission cable module are connected with each other by a wireless transmission technology.

14. A diagnosis method of active transmission cable performance applied in a diagnosis system of active transmission cable performance, the diagnosis method of active transmission cable performance comprising steps of:

a setting and diagnosing step for letting a user to set different binary sequence values of pseudo random numbers, and executing a bit error rate analysis and an eye diagram diagnosis analysis, an intersymbol interference test and a temperature monitoring test;

an inputting and fetching step, after the user sets the different binary sequence values of pseudo random numbers, entering a program interface to proceed with an inputting setup, and simultaneously, after the bit error rate analysis, the eye diagram diagnosis analysis, the intersymbol interference test and the temperature monitoring test are completed, diagnosis results of the bit error rate analysis, the eye diagram diagnosis analysis, the intersymbol interference test and the temperature monitoring test being fetched; and a driving and storing step for driving, controlling, displaying and storing diagnosis results of a loop test, a non-return-to-zero signal transmission test and a signal transmission test of four-order pulse amplitude modulation.

15. The diagnosis method of active transmission cable performance as claimed in claim 14, wherein the diagnosis system of active transmission cable performance includes a diagnostic host having a diagnosis main program module, and a test board, in the setting and diagnosing step, let the user to set the different binary sequence values of pseudo random numbers by virtue of the diagnostic host, and execute the bit error rate analysis, the eye diagram diagnosis analysis, the intersymbol interference test and the temperature monitoring test on an active transmission cable module.

16. The diagnosis method of active transmission cable performance as claimed in claim 15, wherein the diagnostic host and the active transmission cable module are connected with each other by a wire transmission technology, and the test board and the active transmission cable module are connected with each other by a wireless transmission technology.

17. The diagnosis method of active transmission cable performance as claimed in claim 15, wherein the diagnosis main program module includes a management test suite supporting communications of standard management interfaces of a plurality of the pluggable transceiver modules and setting a diagnosis mode, a serdes test suite including a non-return-to-zero signal transmission, a signal transmission of four-order pulse amplitude modulation, the bit error rate analysis and the eye diagram diagnosis analysis of a high-frequency signal transmission, and a diagnosis test suite including the intersymbol interference test and the temperature monitoring test.

18. The diagnosis method of active transmission cable performance as claimed in claim 14, wherein the program interface is a management program interface.

\* \* \* \* \*